United States Patent
Gumbrecht et al.

(10) Patent No.: US 9,488,713 B2
(45) Date of Patent: Nov. 8, 2016

(54) AUTOMATIC HF SHIM CONFIGURATION FOR COILS

(71) Applicants: Rene Gumbrecht, Herzogenaurach (DE); Holger Adolf, Zirndorf (DE); Thomas Benner, Erlangen (DE); Hans-Peter Fautz, Forchheim (DE); Jörg Ulrich Fontius, Neunkirchen A. Brand (DE)

(72) Inventors: Rene Gumbrecht, Herzogenaurach (DE); Holger Adolf, Zirndorf (DE); Thomas Benner, Erlangen (DE); Hans-Peter Fautz, Forchheim (DE); Jörg Ulrich Fontius, Neunkirchen A. Brand (DE)

(73) Assignee: Siemens Aktiengesellschaft, München (DE)

( * ) Notice: Subject to any disclaimer, the term of this patent is extended or adjusted under 35 U.S.C. 154(b) by 646 days.

(21) Appl. No.: 13/956,318

(22) Filed: Jul. 31, 2013

(65) Prior Publication Data
US 2015/0022203 A1 Jan. 22, 2015

Related U.S. Application Data

(60) Provisional application No. 61/847,012, filed on Jul. 16, 2013.

(51) Int. Cl.
*G01R 33/36* (2006.01)
*G01R 33/565* (2006.01)
*G01R 33/24* (2006.01)
*G01R 33/561* (2006.01)

(52) U.S. Cl.
CPC ....... *G01R 33/5659* (2013.01); *G01R 33/3607* (2013.01); *G01R 33/246* (2013.01); *G01R 33/5612* (2013.01)

(58) Field of Classification Search
CPC .......... G01R 33/5659; G01R 33/3607; G01R 33/246; G01R 33/5612
See application file for complete search history.

(56) References Cited

U.S. PATENT DOCUMENTS

| | | | |
|---|---|---|---|
| 2009/0149737 A1* | 6/2009 | Hansen | G01R 33/36 600/421 |
| 2010/0327868 A1 | 12/2010 | Gebhardt et al. | |
| 2011/0121829 A1* | 5/2011 | Umeda | G01R 33/3678 324/309 |
| 2011/0224924 A1 | 9/2011 | Eichfelder et al. | |
| 2011/0263969 A1 | 10/2011 | Fontius | |
| 2012/0256626 A1 | 10/2012 | Adalsteinsson et al. | |

OTHER PUBLICATIONS

Gumbrecht et al., Online Local SAR Supervision for Transmit Arrays at 7T, Siemens Healthcare, Nov. 2012.
Gumbrecht et al., Safe Online Local SAR Calculation for Transmit Arrays Using Asynchron Data Processing, Siemens Healthcare, Nov. 2012.
MAGNETOM 7T, TimTX Array Step 2, 6 pages, www.siemens.com/7T-MRI, Aug. 2012.
Siemens, MAGNETOM 7T, Operator Manual—Tx Array System, pp. 43-66, circulated internally in Jun. 2012 and circulated externally in Jul. 31, 2012.

* cited by examiner

*Primary Examiner* — G. M. Hyder
(74) *Attorney, Agent, or Firm* — Lempia Summerfield Katz LLC

(57) ABSTRACT

In order to configure a transmission coil of a magnetic resonance imaging (MRI) system without taking a specific measurement object into account, the transmission coil is automatically detected and identified when the transmission coil is connected to the MRI system. A phase setting of a pulse to be transmitted by the detected transmission coil is identified based on at least the identified type of the transmission coil. The transmission coil is excited with the pulse having the identified phase and amplitude.

17 Claims, 4 Drawing Sheets

AUTOMATIC HF SHIM CONFIGURATION FOR COILS

This application claims the benefit of provisional patent application No. 61/847,012, filed on Jul. 16, 2013, the disclosure of which is incorporated herein by reference.

FIELD

The present embodiments relate to automatic high frequency (HF) shim configuration for coils of a magnetic resonance imaging (MRI) system.

BACKGROUND

Newer-generation magnetic resonance imaging (MRI) systems may generate and transmit a plurality of individual radio-frequency (RF) pulse trains in parallel over different independent radio-frequency transmit channels. Individual RF signals are applied to the individual transmit channels (e.g., individual coil elements such as the individual rods of a whole-body antenna).

Multichannel transmission coils are operated at defined amplitude and phase settings for the individual channels. An instantaneous spatial excitation field results from local complex superposition of HF fields generated by the individual coil elements. Each individual HF field is dependent on the associated coil element, and with increasing field intensity (e.g., 3T), each individual HF field is also increasingly dependent on an object being examined (e.g., the body of a patient).

HF pulse calibration is provided for patient-specific optimization of MR excitation. Spatial excitation maps (e.g., $B_1$ maps) of the individual coil elements are measured. Based on the measured $B_1$ maps of the individual coil elements, amplitudes and phases of transmit voltages for the individual channels (e.g., $B_1$ shims) are calculated, so that the excitation is optimal for a specific patient in terms of a quality criterion.

SUMMARY

In order to configure a transmission coil of a magnetic resonance imaging (MRI) system without taking a specific measurement object into account, the transmission coil is automatically detected and identified when the transmission coil is connected to the MRI system. A phase and, optionally, an amplitude of a pulse to be transmitted by the detected transmission coil are identified based on at least the identified type of the transmission coil. The transmission coil is excited with the pulse having the identified phase and amplitude.

In a first aspect, a method for configuring a transmission coil of an MRI system is provided. The transmission coil includes a plurality of parallel transmission coil elements. The method includes detecting a type of the transmission coil. A processor identifies a phase setting for a pulse to be transmitted by the detected transmission coil based on the detected type of the transmission coil.

In a second aspect, a non-transitory computer-readable storage medium stores instructions executable by one or more processors to automatically configure a multichannel transmission coil including a plurality of parallel transmission coil elements of an MRI system. The instructions include automatically detecting the multichannel transmission coil when the multichannel transmission coil is connected to the MRI system. The detecting includes identifying a type of the multichannel transmission coil. The instructions also include identifying a high frequency (HF) shim based on the identified type of the multichannel transmission coil. The identified HF shim includes predetermined amplitude and phase settings for pulses for individual channels of the multichannel transmission coil.

In a third aspect, a system for automatic shim configuration for a parallel transmission coil of an MRI system is provided. The system includes a memory configured to store a plurality of predetermined HF shims. The system also includes a processor in communication with the memory. The processor is configured to automatically detect the multichannel transmission coil connected to the MRI system. The detection includes identification of a type of the multichannel transmission coil. The processor is also configured to select an HF shim from the plurality of predetermined HF shims based on the identified type of the multichannel transmission coil. The selected HF shim includes predetermined phase settings for pulses for individual channels of the multichannel transmission coil.

DETAILED DESCRIPTION

Figure 1:
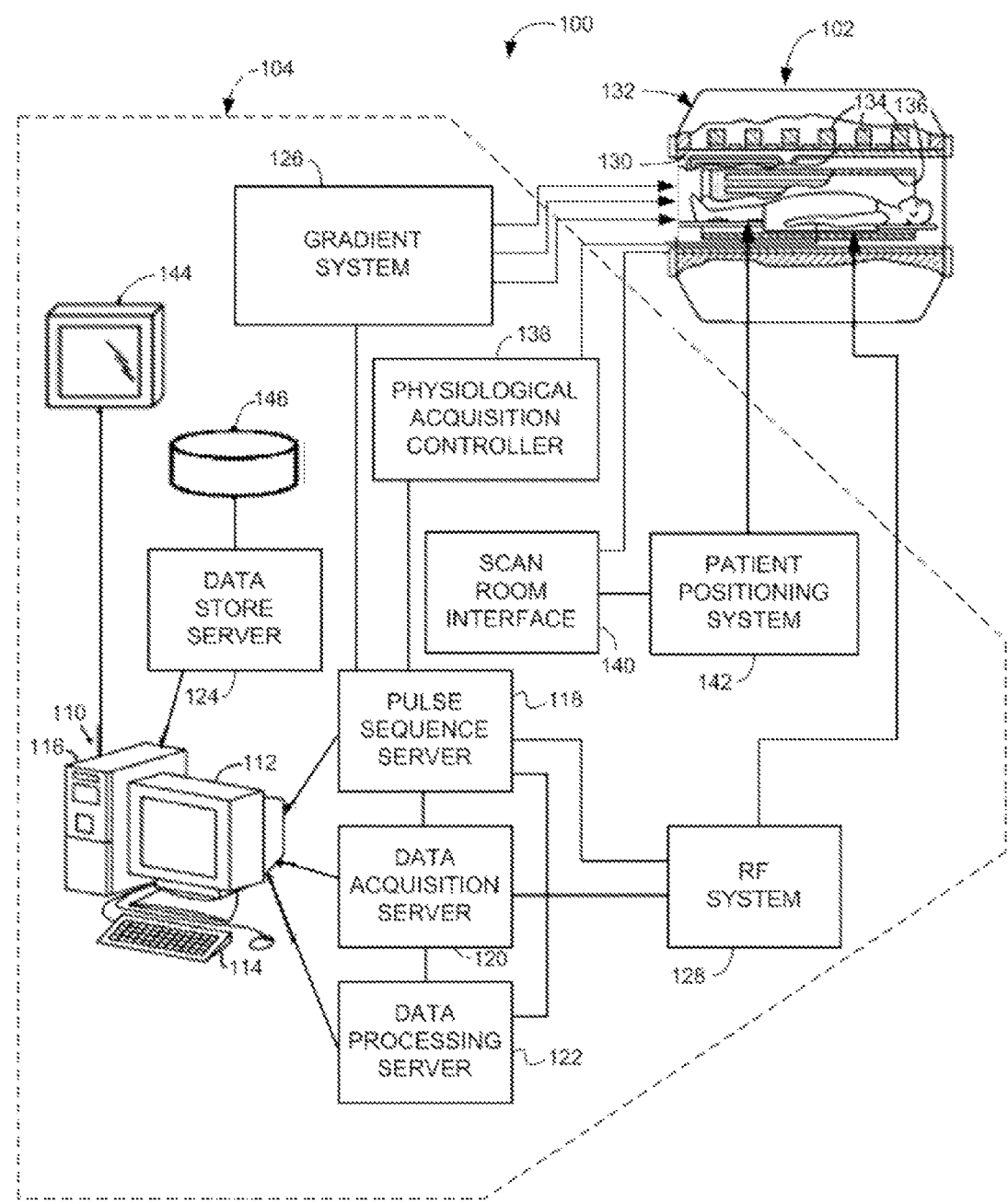
FIG. 1 shows one embodiment of a magnetic resonance imaging (MRI) system.

In magnetic resonance imaging (MRI), shimming is used to minimize inhomogeneities in a magnetic RF or $B_1$ field inside an MRI scanner. Inhomogeneities result mainly from the insertion of a patient into the MRI scanner. Coils with adjustable current may be used to alter the overall magnetic $B_1$ field in the MRI scanner by transmitting pulses with defined amplitudes and phases of transmit voltages (e.g., $B_1$ shims) such that the overall magnetic field is more homogenous.

Newer-generation MRI systems may generate RF pulses with a spatially tailored excitation pattern to mitigate $B_1^+$ inhomogeneity by exciting a spatial inverse of the inhomogeneity. In these systems, a plurality of individual radio-frequency pulse trains are transmitted in parallel over the different independent radio-frequency transmit channels. Individual RF signals are then applied to the individual transmit channels (e.g., the individual rods of a whole-body antenna). This method, referred to as "parallel transmission" or "parallel excitation," exploits variations among the different spatial profiles of a multi-element RF coil array. Parallel excitation has enabled several important applications beyond the mitigation of $B_1^+$ inhomogeneity, including flexibly shaped excitation volumes.

Parallel transmission systems allow reduction of the duration of an RF pulse by undersampling the excitation k-space trajectory (reducing the distance traveled in k-space), thus shortening the corresponding RF pulse. The ability to "accelerate" in the k-space domain arises due to the extra degrees of freedom provided by the system's multiple transmit elements.

Parallel transmission (pTx) systems for radio frequency (RF) pulses in MRI may generate more flexible magnetization profiles than is feasible with conventional single-channel RF systems.

In the prior art, a $B_1$ shim is patient-specific and organ-specific. Imaging is to be provided for localization before $B_1$ shim calculation. An excitation that is as spatially homogeneous as possible is also to be provided for calibrations including recording of the $B_1$ maps. In other words, for calibrations including recording of the $B_1$ maps, a pre-calibration is to be provided. In the prior art, to meet these requirements, the $B_1$ maps are measured and superimposed linearly, a cost function is optimized, and an HF shim determined from the optimized cost function is applied. Recording of the $B_1$ maps and optimization of the cost function may take a long time and may require a large amount of processing power.

In the present embodiments, magnetic resonance (MR) images generated with a maximized homogeneity excitation are provided without patient-specific $B_1$ shimming or before $B_1$ shimming may be implemented. Without taking a specific measurement object into account, an optimal excitation may be dependent only on the coil and on an average measurement object (e.g., representing a typical measurement object).

Upon connection of a multichannel transmission coil, the multichannel transmission coil may be detected automatically. The detection may be done by known digital or analog coil codes. Depending on the coil used, presettings for the HF shim are loaded automatically. The presettings for the HF shim may be selected manually or automatically from a plurality of saved presettings based on the type of the coil used or based on the type of coil used and additional criteria (e.g., application, weight of the patient, position of the patient). For automatic selection, the selection may be based on information about the measurement layout and the patient, or via a calibration measurement. The presettings may be determined empirically or with the aid of simulations. The presettings make optimal excitation possible for a typical use of the coil in a typical measurement object. A method of configuring a transmission coil of an MRI system may be executed with the MRI system of FIGS. 1 and 2 described below or another MRI system.

FIG. 1 shows one embodiment of an MRI system 100. The MRI system 100 may include a scanner or data acquisition unit 102 and a control system 104 for directing the operation of the scanner 102. The control system 104 includes a workstation 110 having one or more output interfaces 112 (e.g., a display) and one or more input interfaces 114 (e.g., a keyboard). The workstation 110 includes a processor 116, which may be a commercially available, programmable machine running a commercially available operating system. The workstation 110 provides an operator interface that enables scan sequences to be entered into or otherwise defined for the control system 104 and the MRI system 100. The workstation 110 may be coupled to a number of servers including, for example, a pulse sequence server 118, a data acquisition server 120, a data processing server 122, and a data store server 124. The workstation 110 and the servers 118, 120, 122 and 124 may communicate with each other via any desired communication technique, protocol, or standard. The components of the control system 104 may be coupled to one another via a data bus or network (not shown) and need not but may be connected via respective, dedicated communication lines as shown. Any one or more of the components of the control system 104 may be implemented as a service unit, module, or other unit implemented by a common physical machine or other device. Additional, different, or fewer components may be provided, such as combining two or more servers or providing the workstation functionality on a server or vice versa.

The processor 116 or a processor of any of the servers 118, 120, 122, and 124 is a general processor, a central processing unit, a control processor, a graphics processor, a digital signal processor, a three-dimensional rendering processor, an image processor, an application-specific integrated circuit, a field-programmable gate array, a digital circuit, an analog circuit, combinations thereof, or other now known or later developed device. The processor is a single device or multiple devices operating in serial, parallel, or separately. The processor may be a main processor of a computer, such as a laptop or desktop computer, or may be a processor for handling some tasks in a larger system. The processor is configured by instructions, design, hardware, and/or software to perform the acts discussed herein, such as configuring a transmission coil of the MRI system 100.

The pulse sequence server 118 functions in response to instructions downloaded from the workstation 110 to operate a gradient system 126 and a radio frequency (RF) system 128. Gradient waveforms to perform the prescribed scan are produced and applied to the gradient system 126. The gradient system 126 excites gradient coils in a gradient coil assembly 130 to produce the magnetic field gradients $G_x$, $G_y$, and $G_z$ used for position-encoding MR signals. The gradient coil assembly 130 forms part of a magnet assembly 132 that includes an annular or other polarizing magnet 134 and a whole-body RF coil array 136.

In some cases, the whole-body RF coil array 136 is constructed in the form of a birdcage antenna and has a number of individual antenna rods that run parallel to the patient tunnel and are uniformly distributed in a circumferential arrangement around the patient tunnel. The individual antenna rods may be capacitively coupled to one another in a ring shape at one end of the birdcage antenna. Other RF coils may be used.

RF excitation waveforms are applied to the RF coil 136 by the RF system 128 to perform a selected magnetic resonance pulse sequence. Responsive MR signals detected by the RF coil 136 or a separate local coil (not shown) are received by the RF system 128, amplified, demodulated, filtered and digitized under direction of the pulse sequence server 118. The RF system 128 includes an RF transmitter for producing a wide variety of RF pulses used in MR pulse sequences. The RF transmitter is responsive to the selected scan sequence and direction from the pulse sequence server 118 to produce RF pulses of the desired frequency, phase and pulse amplitude waveform. The generated RF pulses may be applied to the whole body RF coil 136 or to one or more local coils or coil arrays. As described below, the RF transmitter includes a plurality of transmission channels to produce an overall RF pulse formed via the superimposition of the RF pulses generated by each transmission channel.

The RF system 128 also includes one or more RF receiver channels. Each RF receiver channel includes an RF amplifier that amplifies the MR signal received by the coil to which the RF receiver channel is connected. Each receiver may also include a detector that collects and digitizes in-phase (I) and quadrature (Q) components of the received MR signal.

The pulse sequence server 118 may receive patient data from a physiological acquisition controller 138. The controller 138 receives signals from a number of different sensors connected to the patient, such as ECG signals from electrodes or respiratory signals from a bellows. Such signals may be used by the pulse sequence server 118 to synchronize, or "gate", the implementation of the scan sequence with the subject's respiration or heart beat.

The pulse sequence server 118 also connects to a scan room interface circuit 140 that receives signals from various sensors associated with the condition of the patient or subject and the magnet system. It is also through the scan room interface circuit 140 that a subject positioning system 142 receives commands to move the subject to desired positions during the scan sequence. The subject positioning system 142 may direct one or more motors (not shown) that drive a bed and, thus, the subject, to a desired position.

The digitized MR signal samples produced by the RF system 128 are received by the data acquisition server 120. The data acquisition server 120 operates in response to instructions downloaded from the workstation 110 to receive the real-time MR data and provide buffer storage such that no data is lost by data overrun. In some scan sequences, the data acquisition server 120 does little more than pass the acquired MR data to the data processor server 122. However, in scans that require information derived from acquired MR data to control the further performance of the scan, the data acquisition server 120 is programmed to produce such information and convey the information to the pulse sequence server 118. For example, during calibration or other pre-scans, MR data is acquired and used to calibrate the pulse sequence performed by the pulse sequence server 118. The calibration data may be stored in a memory or storage device or other unit of, associated with, or in communication with, any of the aforementioned servers or other devices.

Memory of any of the servers may be computer readable storage media. The computer readable storage media may include various types of volatile and non-volatile storage media, including but not limited to random access memory, read-only memory, programmable read-only memory, electrically programmable read-only memory, electrically erasable read-only memory, flash memory, magnetic tape or disk, optical media and the like. The memory may be a single device or a combination of devices. The memory may be adjacent to, part of, networked with and/or remote from the processor.

Navigator signals may be acquired during a scan and used to adjust RF or gradient system operating parameters or to control the view order in which k-space is sampled. The data acquisition server 120 may be employed to process MR signals used to detect the arrival of contrast agent in a magnetic resonance angiography (MRA) scan. In all these examples, the data acquisition server 120 acquires MR data and processes the MR data in real-time to produce information that is used to control the scan.

The data processing server 122 receives MR data from the data acquisition server 120 and processes the MR data in accordance with instructions downloaded from the workstation 110. Alternatively, the data processing server 122 receives the MR data directly from the RF system 128. Such processing may include, for example, Fourier transformation of raw k-space MR data to produce two or three-dimensional images, the application of filters to a reconstructed image, the performance of back-projection image reconstruction of acquired MR data, the calculation of functional MR images, the calculation of motion or flow images, segmentation, or other visualization processes.

Images reconstructed by the data processing server 122 are conveyed back to the workstation 110 for storage. Real-time images may be stored in a database memory cache (not shown) from which the images may be output to the display 112 or an auxiliary terminal or console 144, which may be located near the magnet assembly 132 for use by attending physicians or other operators. Batch mode images or selected real time images are stored in a database on mass storage device 146, which may include any desired storage medium. When such images have been reconstructed and transferred to storage, the data processing server 122 notifies the data store server 124 on the workstation 110. The workstation 110 may be used by an operator to archive the images, produce films, or send the images via a network to other facilities.

Figure 2:
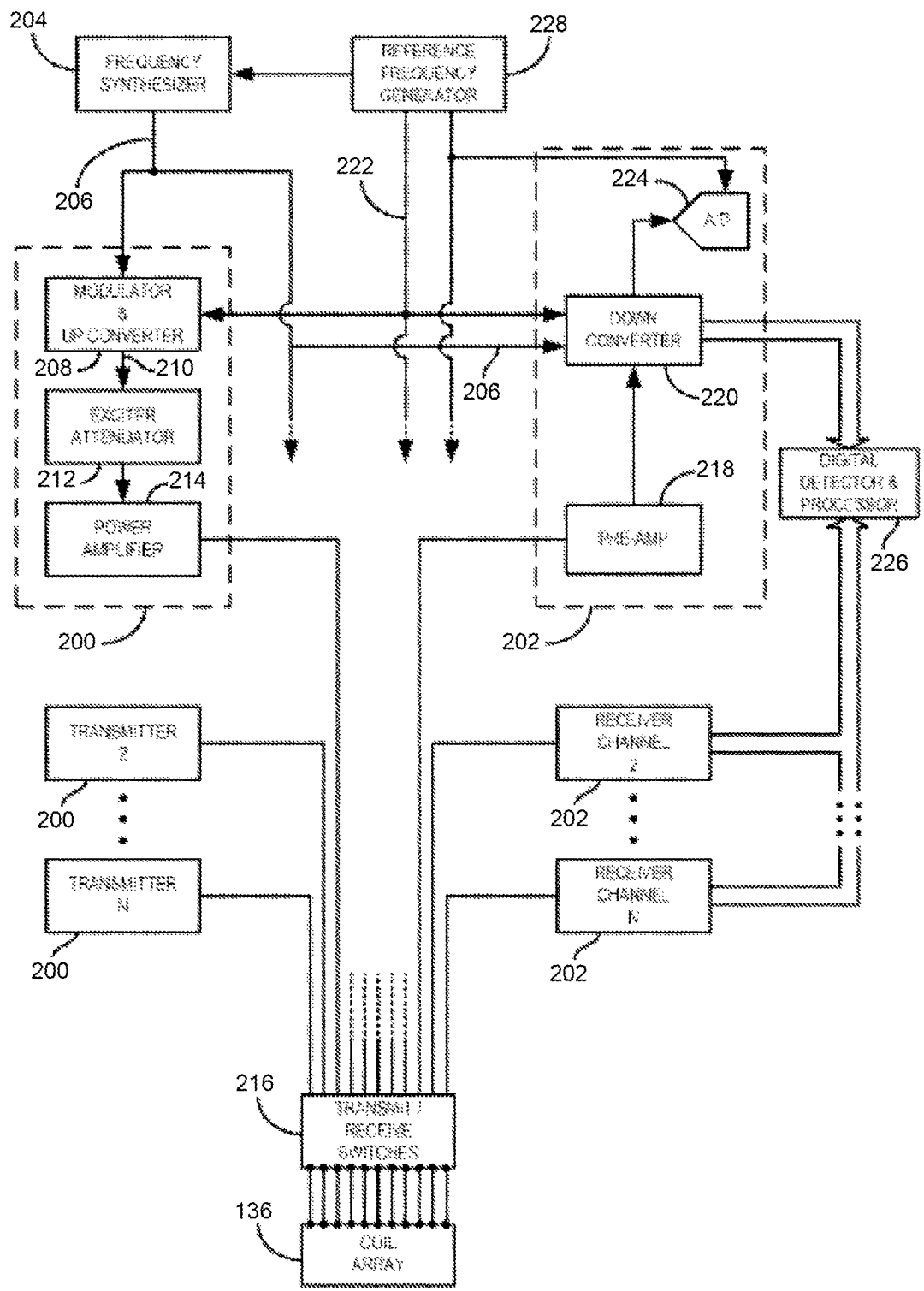
FIG. 2 shows one embodiment of a radio frequency (RF) system and other components of the MRI system of FIG. 1.

As shown in FIG. 2, the RF system 128 and other components of the system 100 are shown in greater detail. The whole body coil array 136 may include a plurality of coil elements that may be separately driven by a plurality of RF transmitters 200 to produce a desired RF field-of-excitation ("FOX"). Each RF transmitter 200 forms one of the array of channels that, when superimposed, collectively define the composite RF signal. The coil array 136 may also be used with a plurality of receive channels 202. Alternatively or additionally, another whole body RF coil array (not shown) or another local RF coil may be used to acquire the MR signals. A variety of different coil array structures may be used as part of the system 100 (FIG. 1).

The RF system 126 includes a set of transmitters 200, each of which produces an individual, selected RF excitation field. The base, or carrier, frequency of this RF excitation field is produced under control of a frequency synthesizer 204, which receives a set of digital control signals from the pulse sequence server 118. These control signals may include data representative of the frequency and phase of the RF carrier signal, which may be produced at an output 206. The RF carrier is applied to a modulator and up converter 208 in each transmitter 200, where the amplitude of the RF carrier is modulated in response to a signal also received from the pulse sequence server 118. The signal defines the envelope of the RF excitation pulse to be produced and is generated by sequentially reading out a series of stored digital values. These stored digital values may be changed to enable any desired RF pulse envelope to be produced by each transmitter 200.

The magnitude of the RF excitation pulse produced at an output 210 is attenuated by an exciter attenuator circuit 212 in each transmitter 200. Each attenuator circuit 212 receives a digital command from the pulse sequence server 118. The attenuated RF excitation pulses are applied to a power amplifier 214 in each transmitter 200. The power amplifiers 214 are current source devices that connect to respective transmit inputs on a set of transmit/receive switches 216. In this example, a desired number N of the transmitters 200 are employed and connected through a corresponding number N of the transmit/receive switches 216 to a corresponding number N of the coil elements in the RF coil array 136.

The signal produced by the subject is picked up by the coil array 136 and applied to the inputs of the set of receive channels 202. A pre-amplifier 218 in each receiver channel 202 amplifies the signal by an amount determined by a digital attenuation signal received from the pulse sequence server 118 (FIG. 1). The received signal is at or around the Larmor frequency, and this high frequency signal is down converted in a two-step process by a down converter 220, which first mixes the NMR signal with the carrier signal on the line 206, and then mixes the resulting difference signal with a reference signal on a line 222. The down converter NMR signal is applied to the input of an analog-to-digital (A/D) converter 224, which samples and digitizes the analog signal and applies the analog signal to a digital detector and signal processor 226 (e.g., MR receiver), which produces 16-bit in-phase (I) values and 16-bit quadrature (Q) values corresponding to the received signal. The resulting stream of digitized I and Q values of the received signal are output to the data acquisition server 120 (FIG. 1) and/or the data processing server 122. The reference signal as well as a sampling control signal applied to the A/D converter 224 are produced by a reference frequency generator 228.

The transmit/receive switches 216 are controlled and directed by the pulse sequence server 118 (FIG. 1) to connect the N transmitters 200 to the N coil elements in the coil array 136 during those parts of the pulse sequence in which an RF field is to be produced. Each transmitter 200 is separately controlled by the pulse sequence server 118 (FIG. 1) to produce an RF field of a desired amplitude, frequency, phase, and envelope at each of the N coil elements. The combined RF fields of the N coil elements produce the prescribed $B_1$ field throughout the region of interest in the subject during the imaging phase of the procedure.

When the $B_1$ field is not produced, the pulse sequence server 118 directs the transmit/receive switches 216 to connect each of the N receive channels to the respective N coil elements. Signals produced by the excited spins in the subject are picked up and separately processed as described above.

When an MRI scan is to be conducted, a transmission coil 300 (e.g., the whole body coil array 136 or another coil) may be plugged into a socket of the MRI system 100. In other embodiments, the transmission coil 300 may be connected to the MRI system 100 in any number of other ways. Once plugged in, the transmission coil 300 may be in communication with one or more components of the MRI system 100 via the transmit/receive switches 216 of the RF system 128, for example, and the MRI scan may be executed according to the description above of FIGS. 1 and 2.

Figure 3:
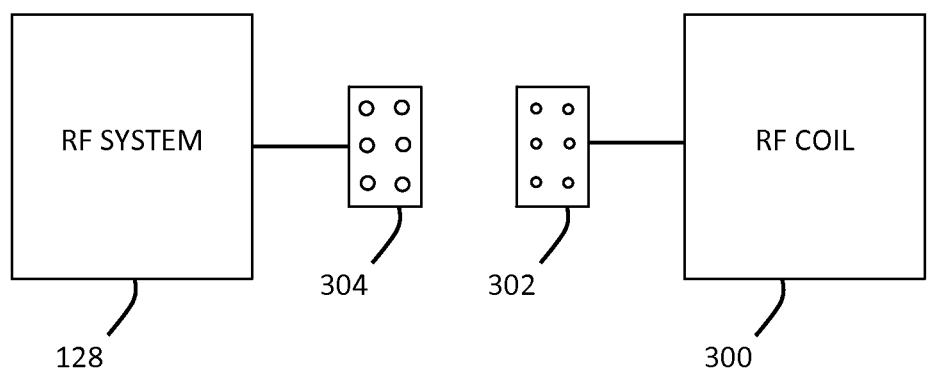
FIG. 3 shows one embodiment of the MRI system where a transmission coil and the RF system are connectable via a plug and socket.

FIG. 3 shows one embodiment of the RF system 128, where the transmission coil 300 and the RF system 128 (e.g., the reset of the RF system) are connectable via a plug 302 and a socket 304. The exemplary embodiment of FIG. 3 shows six prongs and six sockets corresponding to, for example, six coil elements. The plug 302 and the socket 304 may include more or fewer prongs and sockets, respectively. A user of the MRI system 100 may connect (e.g., plug) the transmission coil 300, which includes, for example, the plug 302, to the corresponding socket 304 of the MRI system 100. In one embodiment, the transmission coil 300 includes the socket 302, and the MRI system 100 includes the plug 304. A described below, the transmission coil 300 may include a memory (not shown) that stores a coil code identifying, for example, the type of coil the transmission coil 300 is. The coil code stored in the memory of the transmission coil 300 may be transmitted to the a server of the MRI system, for example, when the transmission coil 300 is connected to the RF system 128.

Figure 4:
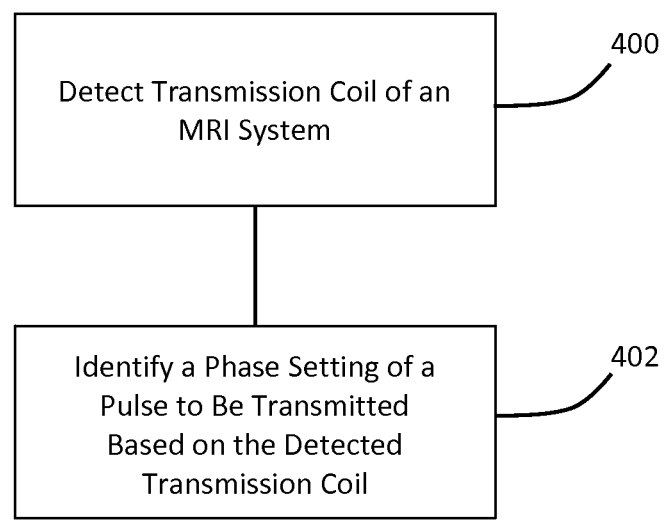
FIG. 4 shows a flowchart of one embodiment of a method for configuring a transmission coil of an MRI system.

FIG. 4 shows a flowchart of one embodiment of a method for configuring a transmission coil of an MRI system. The method may be performed using the MRI system 100 of FIGS. 1-3 or another MRI system. The method is implemented in the order shown, but other orders may be used. Additional, different, or fewer acts may be provided. Similar methods may be used for configuring a transmission coil of an MRI system.

In act 400, a transmission coil of an MRI system is detected. A user of the MRI system may connect (e.g., plug) the transmission coil, which includes, for example, a plug, to a corresponding socket of the MRI system. Via the plug and socket, the transmission coil is in communication with one or more servers and/or workstations (e.g., from FIG. 1, the pulse sequence server 118, the data acquisition server 120, the data processing server 122, and/or the workstation 110). The transmission coil may be connected to the MRI system in other ways, such as contactless connectors.

The transmission coil connected to the MRI system by the user may be a multichannel transmission coil including a plurality of parallel transmission coil elements. For example, the transmission coil may be a sixteen coil element birdcage coil corresponding to sixteen separate transmission channels. The transmission coil may include more or fewer channels and may be configured in any number of shapes. For example, the transmission coil may be shaped in any number of ways to image different body parts of the patient (e.g., the head or the shoulder). In one embodiment, the transmission coil is a single coil element transmission coil. The transmission coil may be a transmit only or may be a transmit/receive coil.

The MRI system (e.g., a processor of a server of the MRI system such as the pulse sequence server 118 of FIG. 1) may detect the transmission coil automatically. For example, the transmission coil may include a memory that stores data representing a code identifying, for example, the type of the transmission coil being used. The stored code may be a digital coil code or an analog coil code. A processor of the MRI system (e.g., a processor of the pulse sequence server 118 or the workstation 110 of FIG. 1) may read the data representing the code stored in the memory of the transmission coil or may receive the data representing the code from the transmission coil when, for example, the transmission coil is connected to the MRI system. In one embodiment, the user of the MRI system determines the type of transmission coil being connected to the MRI system, and enters the coil code corresponding to the type of transmission coil into a workstation, for example.

The transmission coil may be detected when the transmission coil is connected to the MRI system. In other embodiments, the transmission coil may be detected when the MRI system is turned on or may be detected at a predetermined time after the transmission coil is connected to the MRI system.

In act 402, the processor identifies a phase setting of a pulse to be transmitted by the detected transmission coil based on the type of the detected transmission coil. Optionally, the processor may also identify an amplitude setting of the pulse to be transmitted by the detected transmission coil based on the type of the detected transmission coil The processor may automatically identify the phase and the amplitude of the pulse to be transmitted by the detected transmission coil in response to the detecting of the transmission coil. For example, for the multichannel transmission coil connected to the MRI system by the user in act 400, the processor identifies a phase and an amplitude for each parallel pulse to be transmitted by the multichannel transmission coil. The processor may identify phase differences between the channels. Additionally, the processor may identify relative amplitudes between the channels. In other words, in one embodiment, the processor identifies sixteen sets of phase/amplitude combinations for the sixteen parallel pulses to be transmitted by the sixteen parallel transmission channels. The sets of phase/amplitude combinations at least partially define an HF shim.

The processor may be in communication with a memory. The memory may be of the same or a different workstation or server as the processor. The memory may store data representing a plurality of sets of predetermined phase/amplitude combinations (e.g., presettings) that correspond to different types of transmission coils. For example, amongst the plurality of sets of predetermined phase/amplitude combinations that correspond to different types of transmission coils, the memory stores a presetting for the HF shim for the sixteen coil element birdcage coil connected to the MRI system in act 400. The presetting for the HF shim represents an optimal excitation dependent only on the coil and an average measurement object.

The memory may store, for example, coil files that each correlates data representing a type of transmission coil (e.g., data representing a coil code) with data representing a presetting for an HF shim. The processor selects a coil file for the presetting for the HF shim for the sixteen coil element birdcage coil, for example, based on the data representing the coil code identifying the type of the transmission coil being used. The processor may search file names of the coil files or content of the coil files for data representing the identified coil code. In other embodiments, the data representing the coil codes and the corresponding data representing the presettings for the HF shims may be stored in a table in the memory, and the processor may search the table for the identified coil code.

The selected presetting for the HF shim may be loaded automatically. In one embodiment, the selected presetting for the HF shim may be presented to the user via the workstation, and the user may accept, reject, or adjust the selected presetting via the workstation. An object (e.g., a patient) may subsequently be imaged, or the MRI system may be further calibrated using the selected presetting for the HF shim.

In order to better tailor the presetting for the HF shim to the body region to be imaged and the optimization goal, for example, the processor may take additional criteria into account when determining which presetting of the plurality of presettings stored in the memory to select and load. The coil files or the table may include data representing additional information (e.g., additional criteria) that may be used to select a more optimal excitation. For example, the coil files or the table may include data representing application or optimization (e.g., homogenization of the resulting field, maximum efficiency in a subvolume (concentrated RF), high RF in a specified location with a predetermined input power), weight of the patient, position of the patient, information regarding a measurement layout, and/or other information.

The user of the MRI system may enter the additional criteria at the workstation, for example, or the processor may automatically determine the additional criteria from patient data saved in the memory or another memory or from configuration of the MRI system for a given patient. For example, the processor may automatically determine the additional criteria (e.g., the weight of the patient and the body part of the patient to be imaged) based on patient data previously stored in the memory. In one embodiment, the automatic selection may be made based on information derived from a calibration measurement. The processor may select the presetting for the HF shim based on the identified coil code and the additional criteria.

Using the sixteen coil element birdcage coil an example, the memory may store a plurality of different coil files associated with the sixteen coil element birdcage coil. The different coil files associated with the sixteen coil element birdcage coil may be for different weights of the patient, different optimizations, and/or different body regions of the patient to be imaged. Based on the coil code for the sixteen coil element birdcage coil and the additional criteria, the processor or the user may select the most optimal coil file to load. For example, the memory may store coil files associated with the sixteen coil element birdcage coil for a predetermined optimization (e.g., homogenization) for patients weighing 160 lbs., 180 lbs., and 200 lbs., respectively. The processor may determine that the patient to be imaged weighs 185 lbs. and that the goal for the presetting of the HF shim is homogenization from data received from the user or data stored in the memory. The processor may then select and load the presetting for the HF shim from the coil file for the patient weighing 180 lbs. for HF shim homogenization to provide the most optimal initial excitation. In one embodiment, the processor may present the selected presetting to the user at the workstation, for example, for verification of the selected presetting.

In one embodiment, if the processor is unable to determine which coil file to select, the processor may generate a message to be displayed to the user at the workstation requesting the user to select a coil file from the plurality of different coil files stored in the memory.

The presettings for the HF shims included in the coil files or the table may be determined prior to operation of the MRI system. The presettings may be determined, for example, empirically, theoretically, or with the aid of simulations prior to operation of the MRI system and stored in the memory.

One or more of the present embodiments provide coil-specific, automatic HF shim calibration without measurement (e.g., of $B_1$ field maps) to perform calibrations, record localization images, and/or image without prior patient-specific and/or organ-specific imaging. One or more of the present embodiments provide the advantages, compared to the HF pulse calibration of the prior art, of greater robustness, easier calculation (e.g., resulting in less computation time and cost), and a better capability to deal with noise (e.g., HF pulse calibration of the prior art may result in a local minima).

In one or more of the present embodiments, the user or the processor may only need to make small, if any, adjustments to the HF shim after an initial excitation. The patient may be placed in the MRI system, and preliminary images may be generated to locate an object (e.g., an organ). If, however, an arbitrary setting for the HF shim is used instead of the presetting for the HF shim, images may not be generated due to signal losses, or the quality of the images may be so poor that multiple imaging sessions/adjustments may be required.

While the present invention has been described above by reference to various embodiments, it should be understood that many changes and modifications can be made to the described embodiments. It is therefore intended that the foregoing description be regarded as illustrative rather than limiting, and that it be understood that all equivalents and/or combinations of embodiments are intended to be included in this description.

The invention claimed is:

1. A method for configuring a multichannel transmission coil of a magnetic resonance imaging (MRI) system, the multichannel transmission coil comprising a plurality of parallel transmission coil elements, the method comprising:
   detecting a type of the multichannel transmission coil; and
   identifying, with a processor, a high frequency (HF) shim from a plurality of predetermined HF shims based on the detected type of multichannel transmission coil, wherein each HF shim of the plurality of predetermined HF shims comprises predetermined amplitude and phase settings for pulses for individual channels of the multichannel transmission coil.

2. The method of claim 1, wherein the multichannel transmission coil is detected when the multichannel transmission coil is connected to the MRI system.

3. The method of claim 1, wherein the detecting comprises receiving a coil code from the multichannel transmission coil when the multichannel transmission coil is connected to the MRI system.

4. The method of claim 1, wherein the identifying comprises automatically identifying the HF shim in response to the detecting of the multichannel transmission coil.

5. The method of claim 1, wherein the identifying of the HF shim from the plurality of predetermined HF shims is based on the type of the detected multichannel transmission coil and additional criteria,
wherein the additional criteria comprises an application for the MRI system, weight of an object to be imaged, a position of the object, or a combination thereof.

6. The method of claim 1, wherein the identifying comprises automatically identifying the HF shim from the plurality of predetermined HF shims based on data related to a measurement layout and an object to be imaged, or data generated from a calibration measurement.

7. The method of claim 1, further comprising determining a phase setting prior to the detecting and the identifying, the determining comprising determining the phase setting empirically or with aid of one or more simulations for a predetermined use of the multichannel transmission coil and for a predetermined object.

8. The method of claim 1, further comprising imaging an object, the imaging comprising transmitting a pulse with the detected multichannel transmission coil.

9. In a non-transitory computer-readable storage medium that stores instructions executable by one or more processors to automatically configure a multichannel transmission coil comprising a plurality of parallel transmission coil elements of a magnetic resonance imaging (MRI) system, the instructions comprising:
automatically detecting the multichannel transmission coil when the multichannel transmission coil is connected to the MRI system, the detecting comprising identifying a type of the multichannel transmission coil; and
identifying a high frequency (HF) shim from a plurality of predetermined HF shims based on the identified type of the multichannel transmission coil, wherein each HF shim of the plurality of predetermined HF shims comprises predetermined amplitude and phase settings for pulses for individual channels of the multichannel transmission coil.

10. The non-transitory computer-readable storage medium of claim 9, wherein the instructions further comprise initiating imaging of an object, the imaging comprising transmitting the pulses with the detected multichannel transmission coil.

11. The non-transitory computer-readable storage medium of claim 9, wherein the automatically detecting comprises receiving a coil code from the multichannel transmission coil when the multichannel transmission coil is connected to the MRI system.

12. The non-transitory computer-readable storage medium of claim 9, wherein the identifying comprises automatically identifying the high frequency (HF) shim based on the identified type of the multichannel transmission coil in response to the detecting of the multichannel transmission coil.

13. The non-transitory computer-readable storage medium of claim 9, wherein the identifying comprises selecting the HF shim from the plurality of predetermined HF shims based on the type of the detected multichannel transmission coil and additional criteria,
wherein the additional criteria comprises an application for the MRI system, weight of an object to be imaged, a position of the object, or a combination thereof.

14. A system for automatic shim configuration for a parallel transmission coil of a magnetic resonance imaging (MRI) system, the system comprising:
a memory configured to store a plurality of predetermined high frequency (HF) shims;
a processor in communication with the memory and configured to:
automatically detect the multichannel transmission coil connected to the MRI system, the detection comprising identification of a type of the multichannel transmission coil; and
select an HF shim from the plurality of predetermined HF shims based on the identified type of the multichannel transmission coil, wherein each HF shim of the plurality of predetermined HF shims comprises predetermined amplitude and phase settings for pulses for individual channels of the multichannel transmission coil.

15. The system of claim 14, wherein the processor is configured to select the HF shim from the plurality of predetermined HF shims based on the identified type of the multichannel transmission coil, a body region to be imaged, and a predetermined optimization goal.

16. The system of claim 14, wherein the processor is further configured to initiate imaging of a body region to be imaged, the imaging comprising transmission of the pulses with the detected multichannel transmission coil.

17. The system of claim 14, wherein the processor is configured to receive a coil code identifying the type of the multichannel transmission coil in response to the multichannel transmission coil being connected to the MRI system, such that the multichannel transmission coil is automatically detected when the multichannel transmission coil is connected to the MRI system.

* * * * *